April 23, 1968 R. E. HOLMES 3,379,568

PROCESS FOR FORMING HOLES AND MULTILAYER INTERCONNECTIONS
THROUGH A DIELECTRIC

Filed Dec. 21, 1964

INVENTOR.
ROBERT E. HOLMES

BY

A. M. Fernandez

ATTORNEY

United States Patent Office 3,379,568
Patented Apr. 23, 1968

3,379,568
PROCESS FOR FORMING HOLES AND MULTI-LAYER INTERCONNECTIONS THROUGH A DIELECTRIC

Robert E. Holmes, Riverside, Calif., assignor to North American Rockwell Corporation, a corporation of Delaware Continuation-in-part of application Ser. No. 401,392, Oct. 5, 1964. This application Dec. 21, 1964, Ser. No. 423,626
11 Claims. (Cl. 117—212)

ABSTRACT OF THE DISCLOSURE

A process for producing openings in a dielectric film covering an electrically conductive pattern disposed on a dielectric substrate. The process comprises the steps of depositing a vaporizable material at predetermined locations on the conductive pattern; depositing a film of dielectric material atop the substrate, the circuit, and the vaporizable material; and heating the composite. Preferably, the dielectric material is deposited at a temperature below the vaporization temperature of the vaporizable material. Vaporization of the vaporizable material due to the heating forces openings through the deposited dielectric. A second pattern of electrical conductors may be provided atop the dielectric film and interconnected to the lower circuit by depositing metal in the openings produced by vaporization.

This is a continuation-in-part of application Ser. No. 401,392, filed Oct. 5, 1964, now abandoned.

This invention relates to a process for producing openings in dielectric layers and more specifically to a vaporizing process for forming holes and interconnections through thin film dielectric layers between thin film circuits.

Fabrication of multilayer circuits from thin film materials has been limited due to difficulties in forming holes through the dielectric layers for making electrical interconnections from one electrically conductive layer of circuitry to an adjacent electrically conductive layer. Etching processes are sometimes utilized but are limited to particular materials because of the reaction of many materials to the chemical etchants used. Further, it is extremely difficult to control the location, configuration and size of very small holes which are attempted to be produced by etching techniques.

As a result of the problems in producing reliable thin film multilayer circuitry, the use of thin films in advancing electronic technology has not been fully exploited and advantage has not been taken of the reduction in size and weight that is possible with thin films. For example, thin film circuitry has the advantages of dissipating less energy in passive elements and requiring less power for driving active elements.

As an example, a thin film may have a thickness of 0.001 micron or less or a thickness as great as 15 microns or more.

By way of comparison, copper-clad epoxy boards have a dielectric layer thickness of from two to twenty-five mils with the conductor pattern having a thickness of approximately one mil. A mil (0.001 inch) equals 25.4 microns.

Therefore, it is an object of this invention to provide a process for producing thin film multilayer circuitry.

It is still another object of this invention to provide a process for reliably making holes and interconnections from one layer having a thin film conductive pattern thereon through one or more thin film dielectric layers to another layer having a thin film conductive pattern.

It is still a further object of this invention to form precisely located, and precisely shaped openings through thin film dielectric layers.

Other objects of the invention become obvious in connection with the following description and drawings.

Briefly, the invention comprises forming a first electrically conductive pattern on a dielectric, and subsequently depositing a vaporizable material at predetermined locations on the dielectric on the pattern or in close proximity to the pattern. The electrically conductive pattern may, of course, be comprised of metal, semi-conductor or other material. After the vaporizable (or, "volatile" which is used interchangeably therewith) material has been deposited, a thin film layer of a dielectric material is deposited over the pattern and the vaporizable material. Care must be taken to not exceed the vaporizing temperature of the volatile material during deposition of the thin film of dielectric material. Customarily, the first, or bottom dielectric layer provides rigidity and strength to the device and is termed the "substrate." The combination of a substrate, first pattern, volatile material, and thin film dielectric layer is heated to a predetermined temperature causing the volatile material to vaporize and produce an opening through the thin film dielectric layer deposited over it. The temperature must be less than the temperature at which the substrate or dielectric layer undergoes physical change, that is, less than the melting or softening temperature of the rigid substrate or dielectric but sufficient to vaporize the volatile material. And, on the other hand, the temperature at which the volatile material vaporizes must be more than the temperature at which the dielectric layer is deposited or cured. This is required in order that the dielectric layer can be deposited thereon without prematurely vaporizing the volatile material. To some extent, the heating of the substrate, circuit pattern, and the dielectric material are separated and isolated from each other. To such extent, the temperature ranges of the vaporizable material, the dielectric and the electrical pattern may, nevertheless, overlap during manufacture without interfering with the process sought to be performed.

A rigid dielectric substrate may be comprised of ceramic, sapphire, alumina, glass, or a silicon-containing material and may vary in size depending on specific requirements. For example, a substrate may be one square inch and may have a thickness of 0.1 inch or more although for most applications a thickness of from 6 to 40 mils is preferred. The substrate forms the base or supporting layer upon which the multilayer circuitry is formed.

The metal comprising the electrically conductive pattern is ordinarily selected from one of the noble metals, preferably gold, or a good conductor like copper or aluminum. In one embodiment, prior to forming the electrically conductive pattern, a thin layer of metal such as chromium or titanium is deposited on the substrate in order to promote greater adherence between the pattern and the substrate surface. The electrically conductive pattern may have a thickness range of from one-eighth micron to one micron with a preferred thickness of approximately one-fourth of a micron. Other thicknesses are by way of example only.

The volatile or vaporizable material is deposited on or in proximity to the electrical pattern at desired locations. Such locations may be those at which it is desired a portion of an electrically conductive pattern is to be electrically interconnected to at least a portion of a subsequent electrically conductive pattern. The material may be deposited in the form of a dot having a thickness of one to three microns and a diameter of one mil and larger. The opening formed through the dielectric layer has a diameter of approximately that of the deposited volatile material. The material selected is one which will vaporize at a temperature intermediate between the maximum operating temperature of the substrate and the temperature required during the deposition of the dielectric layer. It must have the characteristics of vaporizing at reduced pressure with applied heat. Some examples of volatile materials which may be utilized in the process include zinc, tellurium, cuprous chloride, cuprous iodide, cadmium, chloride, magnesium, and zinc chloride although the process is not intended to be limited to those enumerated.

It should be understood, however, that the vaporizable material may be produced at desired locations by other vaporizable methods. For example, the material may be evaporated over the entire surface and photoetched to form a desired pattern.

The thin film layer of dielectric material is selected in conjunction with the selection of the volatile material so that the critical temperatures do not conflict. The dielectric may have a thickness of five microns or even more, but for most applications a thickness of one micron is preferred. The materials comprising the thin film dielectric are, preferably, silicon monoxide, silicon dioxide, magnesium fluoride, or calcium fluoride, aluminum oxide, magnesium oxide, beryllium oxide, and other suitable dielectrics.

Heat energy is utilized to produce vaporization of the volatile material to form an opening through the dielectric layer. At a sufficiently high temperature the increased vapor pressure of the volatile material ruptures the thin film dielectric immediately over it and the vapor escapes. Thus the defined area has the dielectric flaked off while the rest of the dielectric is not disturbed. After the opening has been formed, there is performed a step for producing a second electrically conductive pattern on the surface of the thin film dielectric layer. During formation of the second pattern, electrical conductors are formed in the openings previousdly produced by the evaporating material, between the first electrically conductive pattern and the second electrically conductive pattern. For example, if the second electrically conductive pattern is formed by vapor deposition, conductive material deposited at an opening is also deposited inside the opening and forms a conductor extending through the dielectric between at least portions of the first and second electrically conductive pattern. Of course, connections may similarly be made to one or more of a third, fourth, or other successive layers. Also, connection may by-pass and not connect to the circuit pattern of a particular layer or layers.

Figure 1:
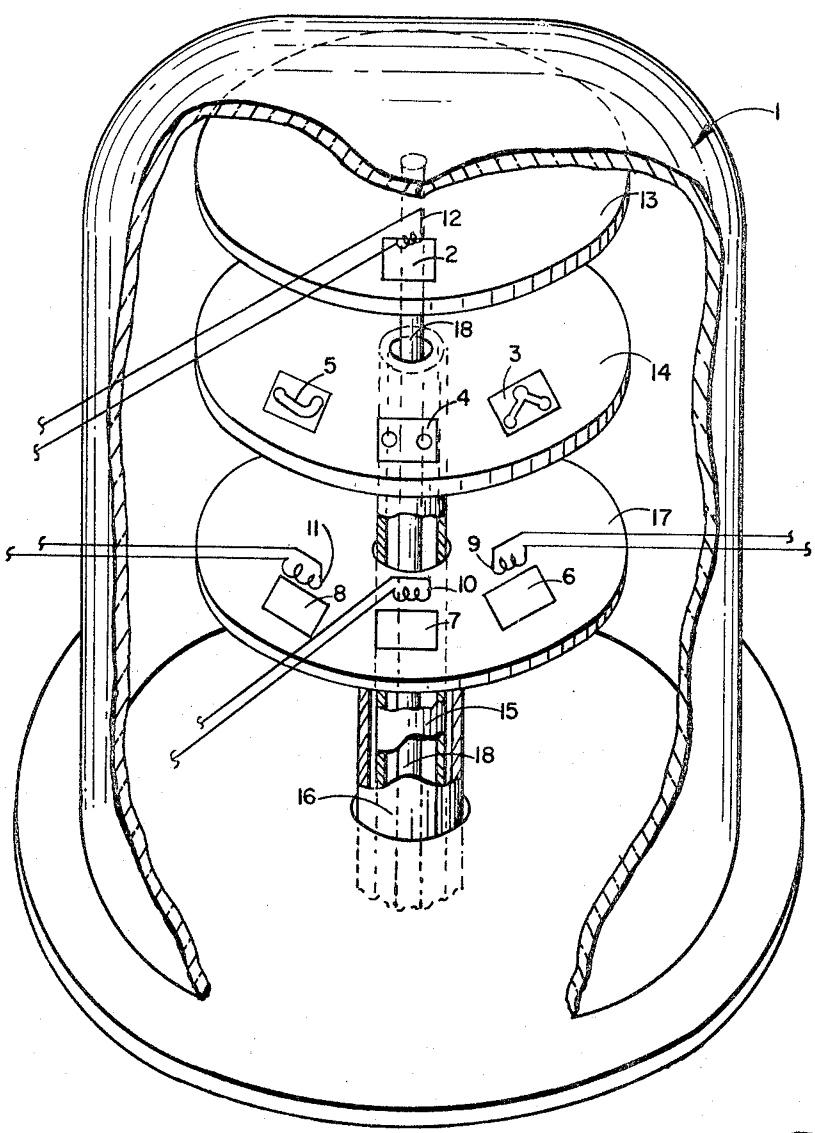
FIG. 1 is an illustration of a system used in the process.

In FIG. 1 a vacuum deposition system is shown comprising chamber 1 which is usually called a "bell jar." Standard equipment for a vacuum system includes vacuum pumps (not shown), power sources (also not shown), and other system components normally comprising the vacuum deposition system.

Figure 3:
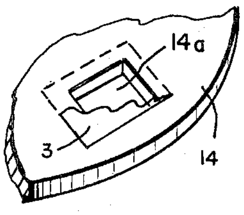
FIG. 3 is a cut-away view showing the opening through the table 14.

Located inside the chamber are the additional components for practicing the invention. Substrate 2 is suspended horizontally on rotating table 13 in the upper portion of chamber 1, with the surface to be utilized in the process pointing downward. FIG. 3 illustrates an aperture **14*a* in table 14 which would permit passage of light or vapor material through the table and through the mask 3. If substrate 2 is placed on top of table 13, it would, of course, require a similar aperture. Masks 4 and 5 also have similar apertures. Shaft 18 permits rotation of the table 13. More than one substrate may be positioned on the table if desired. On second rotating table 14 are located masks 3, 4, and 5. Shaft 15 is connected to table 14 for moving the masks on the table into position under a selected substrate on table 13. The shaft for the second table is positioned inside the shaft for the first. The second table may be positioned hydraulically or mechanically so that the mask is placed in intimate contact with the surface of the substrate during a deposition step. Each mask defines a predetermined pattern. The mask may be made of many materials but for the embodiment described herein they are assumed to be formed from a metallic sheet such as stainless steel. Mask 4 contains a pattern for depositing the material to be vaporized on the substrate. The holes are greatly enlarged for easy visualization. Mask 5 defines a first circuit pattern; mask 3** defines a second circuit pattern. Other masks may be added to the rotating configuration as desired and necessary in a particular application. The circuit masks shown are rudimentary but they may, of course, be highly complicated patterns of electrical wiring and active or passive components such as resistors, inductors, capacitors, transistors and so on.

Underneath the substrate, and on third table 19, supported by shaft 16, are located containers 6, 7 and 8 for holding materials to be deposited through the mask onto the substrate surface 2. The number of containers and the materials placed therein are selected to meet particular requirements. Containers are ordinarily separated from masks by a distance of approximately six inches or more. In other configurations certain of the tables may be stationary or positioned without the use of concentric shafts depending on particular requirements. Other masking and deposition techniques may be used in the practice of the invention.

In a vacuum system, the materials placed in the containers at predetermined intervals are heated and caused to vaporize. The heating is achieved by means of electrical heaters placed underneath the containers or the containers themselves may be the heating elements. Inasmuch as the materials placed in each container may have different vaporizing temperatures, each heater may be equipped with an independent control (not shown). In the alternative, one heater with variable control could be used for all the heating requirements of the containers. In addition, substrate 2 is heated by a heater 12. A heated substrate improves adhesibility of materials deposited thereon. Heaters 9, 10, and 11 are shown for heating containers 6, 7, and 8. Other heating schemes such as electron beams heating or electron bombardment of the materials requiring heat may be used.

The container materials may be comprised of quartz, graphite, alumina, tungsten, tantalum, or other materials which resist high temperatures and the chemical effects of the materials utilized.

A vacuum system is used so that the air molecules will not interfere with the materials being deposited, either by reacting with their vapors or disturbing the line-of-sight geometry of the deposition process. Also at lower pressures, for example $10^{-3}$ torr, the vaporable materials vaporize at lower temperatures. If higher pressures are used, for example atmospheric pressure, higher temperatures are required to vaporize the vaporable materials and possible changes in the substrate material may result.

A more detailed description and illustration of a bell jar system which may be used in the process may be found in Microelectronics and Reliability, June 1964, vol. 3, by H. G. Manfield. The foregoing description is included herein only to facilitate understanding the present invention, and not to limit its practice to the use of such equipment. The invention itself is illustrated in the following examples and defined by the appended claims.

Example I

A substrate is selected, such as a square piece of sheet glass, and suspended horizontally on a rotatable table in a vacuum chamber. The chamber is then exhausted to a $10^{-5}$ torr. The chamber pressure may vary between $10^{-3}$ to $10^{-12}$ and more torrs without interfering with the process.

After the chamber has been evacuated, the substrate is heated to approximately 200° C. Subsequently, an evaporant container containing chromium was rotated into position for depositing chromium on the substrate surface. A mask defining a desired circuit pattern was rotated and interposed between the substrate surface and the container. The chromium in the container is heated to approximately 1000° C. in order to achieve evaporation. The chromium is deposited on the substrate at the outset of the process to improve the bond between the subsequently deposited gold and the substrate layer.

Figure 2:
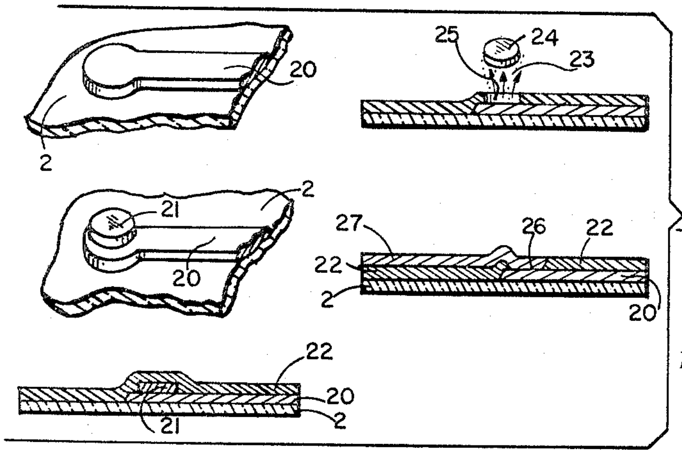
FIG. 2 is an illustration of a portion of a substrate at stages of the process.

After the chromium has been deposited, heat is reduced and a crucible containing the gold material is rotated into position and is heated to a temperature of approximately 1300° C. The gold is deposited onto the previously deposited chromium layer in the desired electrical circuit configuration. The substrate was maintained at 200° C. The gold deposit is shown in FIG. 2 as conductor pattern 20 on substrate 2.

Subsequent to the deposition of the gold conductors, the mask, such as mask 3, defining the circuit pattern is rotated away and another mask, such as mask 4, defining selected points for interconnection between one electrical circuit and an additional electrical circuit is interposed between the substrate surface and a container filled with a vaporizable material such as zinc which has a vaporizing temperature greater than 200° C. and less than 550° C. The volatile materials referred to previously, may, of course, be utilized.

The zinc is then heated to approximately 300° C. until it evaporates and is deposited on the substrate. The zinc deposit is shown in FIG. 2 as deposit 21 on conductor pattern 20. The substrate is not heated during this step. Since the mask 4 defining the interconnection pattern comprised small pinhole-like openings, only small portions of zinc were deposited on the circuit. It is to be noted that the zinc may be deposited in close proximity to the conductor pattern or a portion thereof, as well as on such pattern.

After the zinc has been deposited at selected points on or near the electrical circuit pattern, the mask is rotated out of the way to expose the substrate to a silicon monoxide vapor or some other process for depositing a dielectric film. The silicon monoxide vapor deposits to produce a silicon monoxide film having a thickness of approximately one micron over the electrical circuit and zinc deposits. FIG. 2 illustrates the silicon monoxide film as layer 22.

Thereafter the temperature is raised to approximately 500° C. in order to vaporize the deposited zinc. The vaporized zinc pushes through the dielectric silicon monoxide causing it to rupture locally thereby to produce openings or holes at selected points in the silicon monoxide film. The vaporized zinc is shown in FIG. 2 as vapor 23. The removed portion 24 and the resulting opening or hole 25 in the layer 22 are also shown. Chromium was then deposited on the dielectric surface.

Subsequently, an additional container filled with gold is substituted for the dielectric filled container. A mask defining a second electrical circuit pattern is rotated and interposed between the substrate having the layers deposited thereon and the container filled with gold. The temperature of the gold is then increased and a second gold conducting film approximately one-fourth micron thick dposited on the dielectric surface. The gold deposited in the holes or openings 25 will subsequently interconnect the first circuit layer to the second circuit layer. The second deposited pattern and the interconnection is shown in FIG. 2. The point of contact is illustrated as surface connection 26, connecting second layer 27 to first layer 20. Subsequently, the zinc deposition step and the dielectric deposition steps are repeated and additional layers are formed.

A time of approximately two minutes is required to deposit the zinc at selected points on the circuit. The deposition of the first dielectric layer requires approximately fifteen minutes; of the chromium layer, approximately fifteen seconds; and of the gold, approximately thirty seconds. The time of approximately thirty minutes was required to vaporize the zinc and produce a hole through the dielectric. Thus, the total time for producing a three-layer board is approximately sixty minutes. A three-layer board includes two conducting layers separated by a dielectric layer.

FIG. 3 shows mask 3 cut away to indicate that table 14 has an opening from one surface to the other into which the masks are placed. Mask 3 is placed into opening 14*a*.

Example II

Using the apparatus and following the process as set forth in Example I and using the following materials in lieu of zinc, the following results were obtained.

| Material: | Temperature at which material evaporated ° C. |
|---|---|
| Cadmium | 220 |
| Tellurium | 335 |
| Magnesium | 383 |
| Cuprous chloride | 546 |
| Cuprous iodide | 500 |
| Cadmium chloride | 500 |
| Zinc chloride | 428 |

Silicon monoxide was selected as the dielectric in these examples because of its desirable physical and electrical characteristics. In addition, certain dielectrics and certain metals diffuse together or otherwise undergo a chemical change so that they either form a conductive alloy of a metal or a dielectric which is neither a good dielectric nor a good conducting metal, thereby destroying the usefulness of the combination. Due regard should be had for the limitations of such materials.

It should be point out that even though impractical because of increased temperature requirements and other problems such as increased impurities in the atmosphere, the process could be conducted at atmospheric pressure.

Although the invention has been illustrated and described in detail, it is to be clearly understood that the same is by way of illustration and example only and is not to be taken by way of limitation; the spirit and scope of this invention being limited only by the terms of the appended claims.

I claim:

1. A process for forming openings for electrical interconnections through a dielectric film covering a first electrically conductive pattern, said process comprising the steps of:

depositing a vaporizable material at predetermined locations over at least a portion of said first electrically conductive pattern;

depositing, at a temperature below the vaporization temperature of said vaporizable material, a film of dielectric material over said vaporizable material and said first electrically conductive pattern;

heating said deposited vaporizable material until it vaporizes and produces openings through said film.

2. The process as recited in claim 1 wherein said vaporizable material is deposited at predetermined locations on said first electrically conductive pattern.

3. The process as recited in claim 1 wherein said vaporizable material is selected from the class consisting of zinc, tellurium, cuprous chloride, cuprous iodide, cadmium, cadmium chloride, zinc chloride, and magnesium.

4. The process as recited in claim 1 wherein said dielectric material is selected from the class consisting of silicon monoxide, silicon dioxide, magnesium fluoride, cadmium fluoride, aluminum oxide, magnesium oxide, and beryllium oxide.

5. The process as recited in claim 1 wherein said vaporizable material is selected from the class consisting of zinc, tellurium, cuprous chloride, cadmium, cadmium chloride, zinc chloride, magnesium, and cuprous iodide, and said dielectric material is selected from the class consisting of silicon monoxide, silicon dioxide, magnesium fluoride, calcium fluoride, aluminum oxide, magnesium oxide, and beryllum oxide, and wherein said electrically conductive patterns comprise a noble metal.

6. The process as recited in claim 1 wherein is included the further step of depositing a second electrically conductive pattern on the surface of said dielectric film including depositing electrically conductive material into said produced openings for forming an electrical connection between said first electrically conductive pattern and said second electrically conductive pattern.

7. A process for forming electrical interconnection through a thin dielectric film, said process comprising the steps of:

depositing a vaporizable material at predetermined locations over a first electrical conductor;

depositing, at a temperature below the vaporization temperature of said vaporizable material, a thin film of dielectric material over said vaporizable material and said first electrical conductor;

heating said deposited vaporizable material until it vaporizes and produces openings through said dielectric material; and depositing an electrically conductive material to form a second electrical conductor on said dielectric material, said conductive material also extending into said openings for interconnecting said first and second electrical conductors.

8. A process for forming electrical interconnections to a first pattern of electrical conductors disposed atop a substrate, said interconnections extending through a thin dielectric film, said process comprising the steps of:

depositing a vaporizable material at predetermined locations over said first pattern;

depositing a thin dielectric material over said vaporizable material and said first pattern;

heating the deposited vaporizable material until it vaporizes and produces openings at said predetermined locations through said dielectric material; and depositing a subsequent electrical conductor on said dielectric material, said conductor also extending into said opening and connecting to said first pattern, wherein said dielectric material is selected from the class consisting of silicon monoxide, silicon dioxide, magnesium oxide, aluminum oxide, beryllium oxide, magnesium fluoride, and calcium fluoride, and wherein said vaporizable material is selected from the class consisting of zinc, tellurium, cuprous chloride, and cuprous iodide.

9. In combination:

heating a substrate to a predetermined temperature, said substrate being located inside a vacuum chamber and having at least one surface thereof positioned for having materials deposited thereon;

forming a first electrically conducting pattern on said one surface of said substrate;

depositing an evaporable material at selected points on said first pattern, said material having a temperature of evaporation less than the temperature at which said substrate undergoes undesirable physical change as the result of temperature;

depositing a thin film dielectric layer over said first pattern, evaporable material, and substrate surface while maintaining said substrate and said evaporable material below said temperature of evaporation;

heating the combination of said substrate, first pattern, evaporable material, and dielectric layer to a predetermined temperature, said temperature being lower than the temperature at which the substrate undergoes undesirable physical change and (at least) high enough to vaporize said material for producing openings through said dielectric layer;

forming a second electrically conductive metal pattern on said dielectric layer including forming electrical connections from said first pattern to said second pattern through said produced openings.

10. The process defined in claim 9 wherein said substrate is selected from the class consisting of ceramic, sapphire, alumina, glass and silicon, and wherein said evaporable material is selected from the class consisting of zinc, tellurium, cuprous chloride, cuprous iodide, cadmium, cadmium chloride, magnesium, and zinc chloride.

11. The process defined in claim 10 wherein said electrically conducting patterns are formed from a material selected from the class consisting of the noble metals, copper and aluminum, and wherein said dielectric material is selected from the class consisting of silicon monoxide, silicon dioxide, magnesium fluoride, calcium fluoride, aluminum oxide, magnesium oxide, and beryllium oxide.

References Cited

UNITED STATES PATENTS 3,237,271 3/1966 Arnold et al. ----- 117—217 X

FOREIGN PATENTS 1,093,162 11/1960 Germany.

OTHER REFERENCES

W. Chace & H. Moore, "Exploding Wires," Plenum Press, New York, 1962, vol. 2, pp. 283–285.

ALFRED L. LEAVITT, *Primary Examiner.*

A. M. GRIMALDI, *Assistant Examiner.*